United States Patent [19]

Shinbara

[11] Patent Number: 5,084,632

[45] Date of Patent: Jan. 28, 1992

[54] ASYMMETRICAL SIGNAL GENERATOR CIRCUIT

[75] Inventor: Seitaro Shinbara, Yokohama, Japan

[73] Assignee: Kabushiki Kaisha Toshiba, Kanagawa, Japan

[21] Appl. No.: 686,386

[22] Filed: Apr. 17, 1991

[30] Foreign Application Priority Data

Apr. 19, 1990 [JP] Japan ............................ 2-103537

[51] Int. Cl.⁵ .............................................. H03K 5/00
[52] U.S. Cl. ...................................... 307/261; 307/264; 307/360
[58] Field of Search ............... 307/264, 261, 355, 360; 372/38; 330/261

[56] References Cited

U.S. PATENT DOCUMENTS

| | | | |
|---|---|---|---|
| 4,647,792 | 3/1987 | Meslener et al. | 307/254 |
| 4,743,783 | 5/1988 | Isbell et al. | 307/529 |
| 4,806,803 | 2/1989 | Yamashita | 307/355 |

Primary Examiner—Stanley D. Miller
Assistant Examiner—Toan Tran
Attorney, Agent, or Firm—Banner, Birch, McKie & Beckett

[57] ABSTRACT

A first reference signal whose components have the same amplitude and are symmetrical is supplied to the bases of a first and second transistors, the collectors of which are each connected to a power supply. A first resistor is connected between the emitters of the first and second transistors. A first constant current source is connected to the emitter of the first transistor. A second reference signal of a constant amplitude is supplied to the bases of a third and fourth transistors, the collectors of which are each connected to a power supply. A second resistor different in resistance from the first resistor is connected between the emitters of the third and fourth transistors. A second constant current source is connected to both the emitters of the second and third transistors, while a fourth constant current source is connected to the emitter of the fourth transistor. These first, seocnd, and third constant current sources produce the same current.

7 Claims, 2 Drawing Sheets

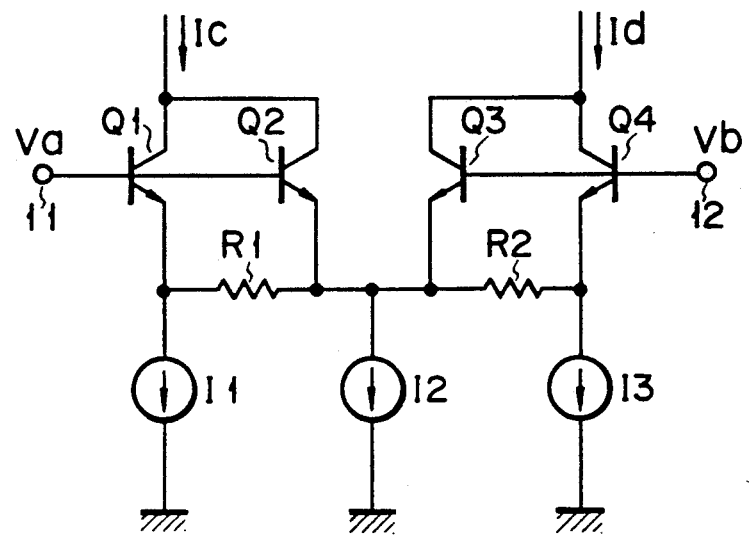
F I G. 1
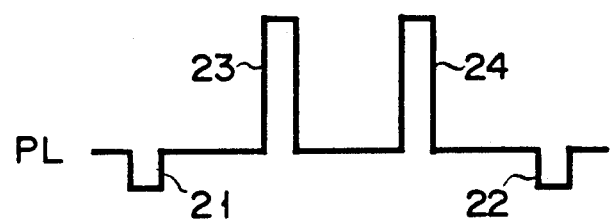
F I G. 2

F I G. 3
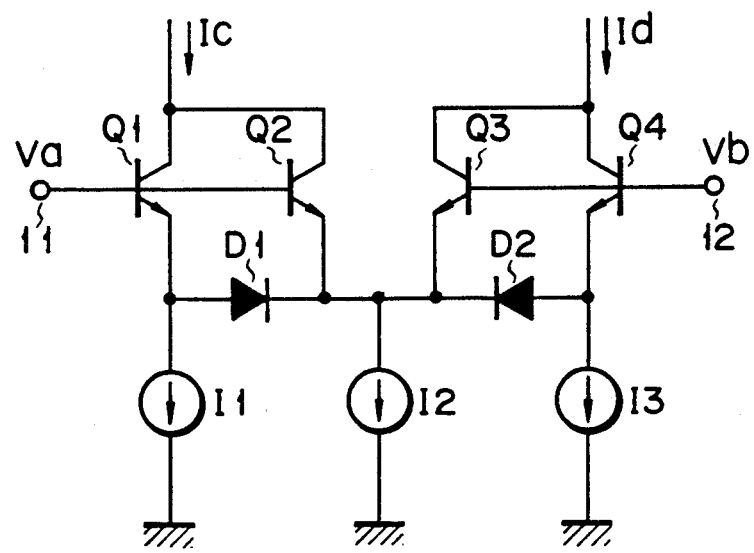
F I G. 4

ASYMMETRICAL SIGNAL GENERATOR CIRCUIT

Background of the Invention

1. Field of the Invention

This invention relates to an asymmetrical signal generator, and more particularly to an asymmetrical signal generator that generates an asymmetrical signal used for adjustment of VTR devices or the like.

2. Description of the Related Art

In PAL (phase alternation by line) VTR devices, for example, an asymmetrical signal as shown in FIG. 2 is used to adjust the frequency of a carrier signal. The asymmetrical signal consists of frequency adjusting signals 23 and 24 located between adjacent horizontal synchronizing signals.

Conventionally, such an asymmetrical signal is produced by first generating a signal whose component's amplitudes are symmetrical with respect to the reference level PL as shown in FIG. 3 and then using this symmetrical signal to form an asymmetrical signal with respect to the reference level PL.

However, conventional asymmetrical signal generator circuits need 20 to 30 circuit elements to produce an asymmetrical signal, so that their circuit arrangement is complicated.

SUMMARY OF THE INVENTION

The object of the present invention is to provide an asymmetrical signal generator circuit with a simple circuit arrangement having a smaller number of circuit elements.

The object of the invention is achieved by an asymmetrical signal generator circuit, comprising: a first and second transistors each of which receives at its control signal input terminal a first reference signal whose components have the same amplitude and are symmetrical, and each of which has one end of the conducting path connected to a power supply; a first current limiting element, connected between the other ends of the conducting paths of said first and second transistors, for limiting current; a first constant current circuit, connected to the other end of the conducting path of said first transistor, for generating a constant current; a third and fourth transistors each of which receives at its control signal input terminal a second reference signal with a constant amplitude, and has one end of the conducting path connected to a power supply; a second current limiting element, connected between the other ends of the conducting paths of said third and fourth transistors, for limiting current; a second constant current circuit, connected to both the other ends of the conducting paths of said second and third transistors, for generating a constant current; and a third constant current circuit, connected to the other end of the conducting path of said fourth transistor, for generating a constant current.

According to this invention, for example, with the first and second current limiting elements being different in the circuit constants from each other and the first through third constant current circuits having the same circuit constants, when the second reference signal is held constant and the first reference signal whose components have the same amplitude and are symmetrical is supplied, an asymmetrical signal is generated between a point where one end of the conducting path of each of the first and second transistors is connected in common, and a point where one end of the conducting path of each of the third and fourth transistors is connected in common.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of a first embodiment of the present invention;

FIG. 2 shows an asymmetrical signal;

FIG. 3 shows a signal used to generate an asymmetrical signal; and

FIG. 4 is a circuit diagram of a second embodiment of the present invention.

DETAILED DESCRIPTION OF THE PREFERRED EMBODIMENT

Referring to the accompanying drawings, the present invention will explained hereinafter.

FIG. 1 illustrates a first embodiment of the present invention. Here, connected to a signal input terminal 11 are the bases of transistors Q1 and Q2, the collectors of which are connected to a power supply and an output terminal (both not shown). The emitter of the transistor Q1 is connected to the ground via a constant current source T1 and to the emitter of the transistor Q2 via a resistor R1. The emitter of the transistor Q2 is also connected to the ground via a constant current source I2.

On the other hand, connected to a signal input terminal 12 are the bases of transistors Q3 and Q4, the collectors of which are connected to a power supply and an output terminal (both not shown). The emitter of the transistor Q4 is connected to the ground via a constant current source I3 and to the emitter of the transistor Q3 via a resistor R2. The emitter of the transistor Q3 is also connected to both the emitter of the transistor Q2 and the constant current source I2.

In this configuration, with the signal input terminal 12 held at a constant voltage Vb, when the signal input terminal 11 receives a given voltage Va meeting the voltage condition of Va>Vb, the transistor Q3 is cut off because the emitters of the transistors Q2 and Q3 are connected one another. In this state, since the transistors Q1 and Q2 share each other's bases and collectors, the current flowing through the resistor R2 is expressed as (Va-Vb)/R2, while the current Ic flowing through the transistors Q1 and Q2 and the current Id flowing through the transistors Q3 and Q4 are respectively expressed as:

$$Ic = I1 + I2 + (Va - Vb)/R2$$

$$Id = -(Va - Vb)/R2 + I3$$

On the other hand, under the condition of Va<Vb, the transistor Q2 is cut off, with the result that the currents Ic and Id are respectively expressed as:

$$Ic = I1 - (Vb - Va)/R1$$

$$Id = (Vb - Va)/R1 + I2 + I3$$

With the resistance of resistor R1 larger than that of resistor R2 or R1>R2, and the signal input terminal 12 fixed to, for example, the reference level PL as shown in FIG. 3, if the signal input terminal 11 receives a signal whose components have the same amplitude and are symmetrical with the reference level PL as shown in FIG. 3, then an asymmetrical signal as shown in FIG. 2 will be produced in the operation described above. FIG. 2 shows the waveform of current Ic provided that the direction of current at each portion indicate the positive polarity.

In this embodiment, the resistor R1 is connected between the emitters of the transistors Q1 and Q2 whose collectors are connected to each other, while the resistor R2 different in resistance from the resistor R1 is connected between the emitters of the transistors Q3 and Q4 whose collectors are connected to one another, with the emitters of the transistors Q2 and Q3 being connected to each other. With the base bias of the transistor Q4 being constant, changing the base voltage of the transistor Q1 results in a change in the currents flowing through the collectors of the transistors Q1 and Q2, and Q3 and Q4, causing an asymmetrical signal.

In addition to this, the circuit of this embodiment has a smaller number of component elements than conventional equivalents and is simpler in configuration, making the manufacture easier.

While in the above embodiment, the resistors R1 and R2 are set for suitable resistances to produce an asymmetrical signal, the constant current sources I1, I2, and I3 may be set for suitable current values with the resistors R1 and R2 being set for the same resistance, which also generates a similar asymmetrical signal. In this case, the constant currents I1, I2, and I3 may be set in magnitude so as to meet the condition of, for example, I1>I2->I3 or I1<I2<I3.

FIG. 4 illustrates a second embodiment of the present invention. In this embodiment, diodes D1 and D2 are used as the current limiting elements instead of the resistors R1 and R2. With this arrangement, an asymmetrical signal corresponding to a small input signal can be produced by making use of the nonlinear characteristics of the diodes D1 and D2.

Although in the above embodiments, bipolar transistors are used to constitute the circuit, other elements such as FETs may be used.

This invention may be practiced or embodied in still other ways without departing from the spirit or essential character thereof.

What is claimed is:

1. An asymmetrical signal generator circuit, comprising:
   first and second transistors each having a control signal input terminal and two terminal ends defining a conducting path, each of said first and second transistors receives at its control signal input terminal a first reference signal having opposite polarity pulses of the same amplitude, and further having one terminal end of the conducting path connected to a power supply;
   a first current limiting element, connected between the other terminal ends of the conducting paths of said first and second transistors, for limiting current;
   a first constant current circuit, connected to the other terminal end of the conducting path of said first transistor, for generating a constant current;
   third and fourth transistors each having a control signal input terminal and two terminal ends defining a conducting path, each of said third and fourth transistors receives at its control signal input terminal a second reference signal with a constant amplitude, and further having one terminal end of the conducting path connected to a power supply;
   a second current limiting element, connected between the other terminal ends of the conducting paths of said third and fourth transistors, for limiting current;
   a second constant current circuit, connected to both the other terminal ends of the conducting paths of said second and third transistors, for generating a constant current; and
   a third constant current circuit, connected to the other terminal end of the conducting path of said fourth transistor, for generating a constant current.

2. An asymmetrical signal generator circuit according to claim 1, wherein said first and second current limiting elements are resistors different in resistance from each other, and said first through third constant current circuits produce the same constant current.

3. An asymmetrical signal generator circuit according to claim 1, wherein said first and second current limiting elements are resistors having the same resistance, and said first through third constant current circuits each produce different currents from each other.

4. An asymmetrical signal generator circuit according to claim 1, wherein said second reference signal is a signal with a constant amplitude, and said first reference signal is a signal whose components have the same amplitude and are symmetrical.

5. An asymmetrical signal generator circuit according to claim 1, wherein each of said first and second current limiting elements is constituted by a diode.

6. An asymmetrical signal generator circuit, comprising:
   first and second transistors each having a control signal input terminal and two terminal ends defining a conducting path, each of said first and second transistors receives at its control signal input terminal a first reference signal having opposite polarity pulses of the same amplitude, and further having one terminal end of the conducting path connected to a power supply;
   a first resistor connected between the other terminal ends of the conducting paths of said first and second transistors;
   a first constant current circuit, connected to the other terminal end of the conducting path of said first transistor, for generating a constant current;
   third and fourth transistors each having a control signal input terminal and two terminal ends defining a conducting path, each of said third and fourth transistors receives at its control signal input terminal a second reference signal with a constant amplitude, and further having one terminal end of the conducting path connected to a power supply;
   a second resistor different in resistance from said first resistor, connected between the other terminal ends of the conducting paths of said third and fourth transistors;
   a second constant current circuit, connected to both the other terminal ends of the conducting paths of said second and third transistors, for generating a constant current; and
   a third constant current circuit, connected to the other terminal end of the conducting path of said fourth transistor, for generating a constant current, said first, second, and third constant current circuits generating the same current.

7. An asymmetrical signal generator circuit, comprising:
- first and second transistors each having a control signal input terminal and two terminal ends defining a conducting path, each of said first and second transistors receives at its control signal input terminal a first reference signal having opposite polarity pulses of the same amplitude, and further having one terminal end of the conducting path connected to a power supply;
- a first diode connected between the other terminal ends of the conducting paths of said first and second transistors;
- a first constant current circuit, connected to the other terminal end of the conducting path of said first transistor, for generating a constant current;
- third and fourth transistors each having a control signal input terminal and two terminal ends defining a conducting path, each of said third and fourth transistors receives at its control signal input terminal a second reference signal with a constant amplitude, and further having one terminal end of the conducting path connected to a power supply;
- a second diode connected between the other terminal ends of the conducting paths of said third and fourth transistors;
- a second constant current circuit, connected to both the other terminal ends of the conducting paths of said second and third transistors, for generating a constant current; and
- a third constant current circuit, connected to the other terminal end of the conducting path of said fourth transistor, for generating a constant current, said first, second, and third constant current circuits generating the same current.

* * * * *